(12) United States Patent
Khanna

(10) Patent No.: US 6,903,953 B2
(45) Date of Patent: Jun. 7, 2005

(54) CONTENT ADDRESSABLE MEMORY WITH CASCADED ARRAY

(75) Inventor: Sandeep Khanna, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/739,246

(22) Filed: Dec. 17, 2003

(65) Prior Publication Data

US 2004/0105290 A1 Jun. 3, 2004

Related U.S. Application Data

(63) Continuation of application No. 10/211,774, filed on Aug. 1, 2002, now Pat. No. 6,842,358.

(51) Int. Cl.$^7$ ................................................ G11C 7/00
(52) U.S. Cl. ............... 365/49; 365/189.05; 365/189.07; 711/108
(58) Field of Search .............................. 365/49, 189.05, 365/189.07; 711/108

(56) References Cited

U.S. PATENT DOCUMENTS

| | | | |
|---|---|---|---|
| 3,868,642 A | | 2/1975 | Sachs |
| 4,845,668 A | | 7/1989 | Sano et al. |
| 5,485,418 A | | 1/1996 | Hiraki et al. |
| 5,642,322 A | | 6/1997 | Yoneda |
| 5,859,791 A | | 1/1999 | Schultz et al. |
| 5,870,324 A | | 2/1999 | Helwig et al. |
| 5,930,359 A | | 7/1999 | Kempke et al. |
| 5,964,857 A | * | 10/1999 | Srinivasan et al. ......... 710/244 |
| 6,081,442 A | | 6/2000 | Igarashi et al. |
| 6,098,147 A | | 8/2000 | Mizuhara |
| 6,137,707 A | | 10/2000 | Srinivasan et al. |
| 6,243,280 B1 | | 6/2001 | Wong et al. |
| 6,301,636 B1 | * | 10/2001 | Schultz et al. .............. 711/108 |
| 6,339,539 B1 | | 1/2002 | Gibson et al. |
| 6,373,738 B1 | * | 4/2002 | Towler et al. ................ 365/49 |
| 6,493,793 B1 | | 12/2002 | Pereira et al. |
| 6,499,081 B1 | | 12/2002 | Nataraj et al. |
| 6,521,994 B1 | | 2/2003 | Huse et al. |
| 6,538,947 B2 | * | 3/2003 | Ahmed et al. .............. 365/207 |
| 6,539,455 B1 | | 3/2003 | Khanna et al. |
| 6,542,391 B2 | | 4/2003 | Pereira et al. |
| 6,597,595 B1 | | 7/2003 | Ichiriu et al. |
| 6,690,595 B1 | * | 2/2004 | Srinivasan et al. ........... 365/49 |
| 6,697,276 B1 | * | 2/2004 | Pereira et al. ................ 365/49 |
| 6,707,693 B1 | * | 3/2004 | Ichiriu ........................ 365/49 |
| 6,728,124 B1 | * | 4/2004 | Ichiriu et al. ................. 365/49 |
| 6,829,153 B1 | * | 12/2004 | Park et al. .................... 365/49 |
| 2002/0129199 A1 | | 9/2002 | Srinivasan et al. |
| 2003/0065880 A1 | | 4/2003 | Gordon et al. |

FOREIGN PATENT DOCUMENTS

WO    WO 03/019572 A1    3/2003

OTHER PUBLICATIONS

Keikichi Tamaru, "The Trend of Functional Memory Development," IEICE Trans Electron., vol. E76–C, No. 11, Nov. 1993, pp. 1545–1554.

* cited by examiner

Primary Examiner—Viet Q. Nguyen
(74) Attorney, Agent, or Firm—Shemwell Gregory & Courtney LLP

(57) ABSTRACT

A content addressable memory (CAM) device having a cascaded CAM array. The cascaded CAM array includes a first array of CAM cells and a second array of CAM cells. A first plurality of compare signal lines is coupled to the first array CAM cells and a second plurality of compare signal lines coupled to the second array of CAM cells. A plurality of storage elements have inputs coupled to the first plurality of compare signal lines and outputs coupled to the second plurality of compare signal lines.

9 Claims, 11 Drawing Sheets

PRIOR-ART

CONTENT ADDRESSABLE MEMORY WITH CASCADED ARRAY

CROSS-REFERENCE TO RELATED APPLICATIONS

This application is a continuation of U.S. patent application Ser. No. 10/211,774 filed Aug. 1, 2002 now U.S. Pat. No. 6,842,358 and entitled "Content Addressable Memory Device with Cascaded Array."

FIELD OF THE INVENTION

The present invention relates generally to content addressable memory devices, and more particularly to search operations within content addressable memory devices.

BACKGROUND

Content addressable memory (CAM) devices are often used in applications which require high-speed database searching. For example, CAM devices are commonly used in network switches and routers to determine forwarding destinations and routing policies for incoming packets. In a typical application, a CAM device compares a selected portion of an incoming packet, referred to as a search key, with a database of values stored in an associative storage array within the CAM device. If the search key matches a stored value, the CAM device generates an index that corresponds to the location of the matching value within the storage array, and asserts a match flag to signal the match. The index is then typically used to address another storage array, either within or separate from the CAM device, to retrieve a destination address or other routing information for the packet.

FIG. 1 illustrates a prior-art CAM device, including a CAM array 101, comparand generator 103, priority encoder 105 and flag circuit 107. Search keys are input one after another to the comparand generator which responds by generating corresponding compare values (i.e., "comparands") and differentially driving the compare values into the CAM array via compare signal lines 111. The CAM array 101 is an associative storage that includes an array of store-and-compare elements 109 referred to as CAM cells. Each CAM cell 109 includes a storage element to store a bit of data and a compare circuit to compare the bit of data to a comparand bit received via the compare signal lines 111. Because a dedicated compare circuit is provided within each CAM cells, database values stored in respective rows of the CAM cells may be simultaneously compared with a comparand value driven onto the compare signal lines 111. The compare circuits within each row of CAM cells are coupled in parallel to a respective match line 113. The match line is typically pulled up to a match-indicating level and pulled down to indicate a mismatch by any one or more of the match circuits that detect a mismatch between a stored value and an incoming comparand bit. The priority encoder and flag circuit are coupled to the match lines to receive the match signals (i.e., match line levels) from each row of CAM cells. The priority encoder generates a match index that corresponds to the address of the highest priority row of CAM cells for which a match is signaled, and the flag circuit generates a match flag signal that indicates, for each compare operation, whether a match was detected.

Over successive generations, CAM arrays have become increasingly dense, in some cases having several thousand CAM cells coupled to each compare signal line. As each CAM cell contributes a parasitic capacitance to the compare signal line, the capacitive loading in such large CAM arrays significantly increases the time required for a comparand bit to become valid (i.e., settle) along the length of a given compare signal line, thereby increasing the overall search cycle time and reducing the throughput of the CAM device.

One approach to reducing the capacitive loading in a large CAM array is to divide the CAM array into smaller, discrete arrays commonly referred to as CAM blocks, with each CAM block having a dedicated comparand generator, priority encoder and flag circuit. While such smaller arrays usually enable faster searching, replication of the comparand generator (and other circuitry, such as read/write circuitry) consumes significant die space within the CAM device, reducing the die space available for data storage.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
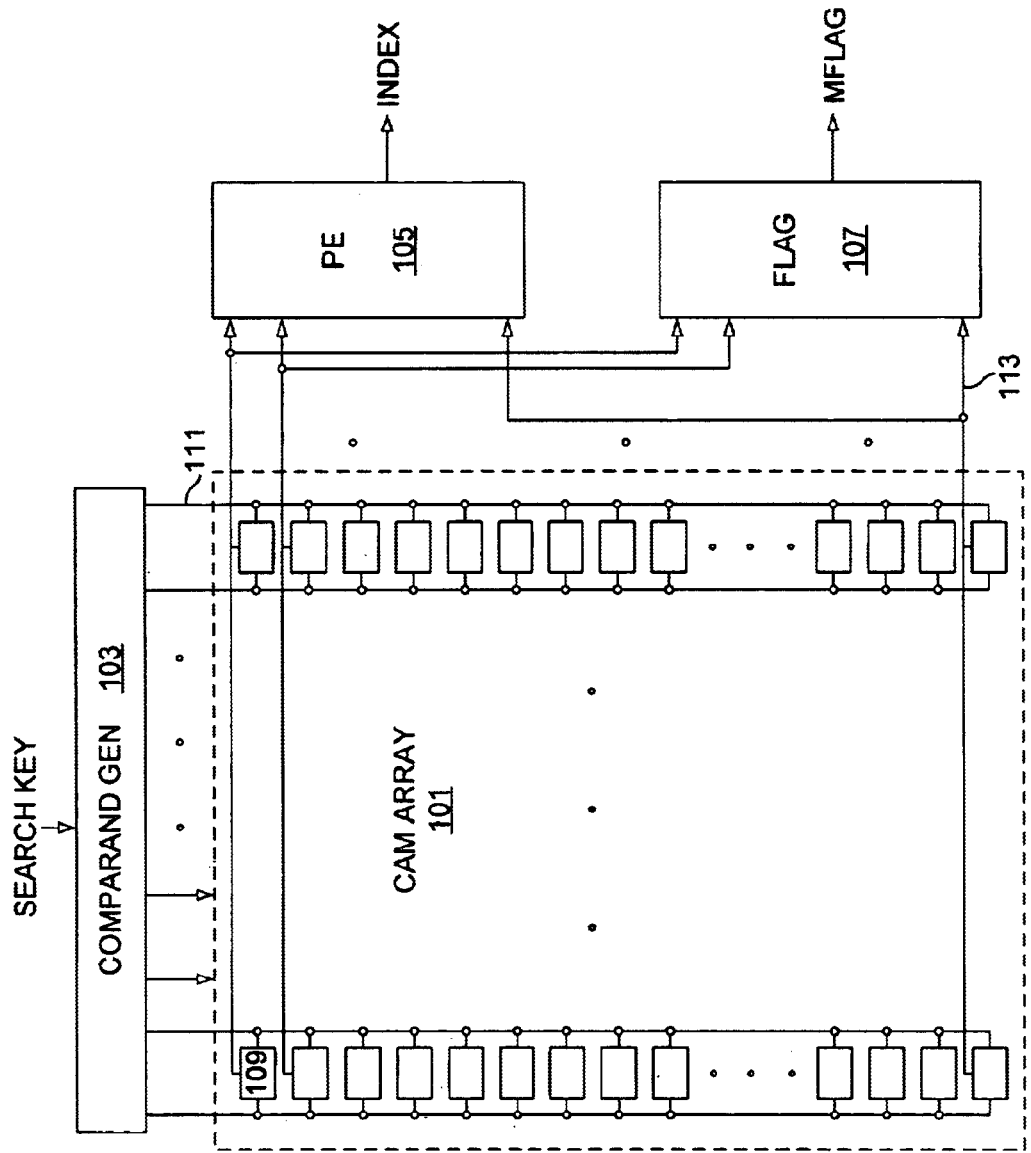
FIG. 1 illustrates a prior-art CAM device.

In the following description and in the accompanying drawings, specific nomenclature and drawing symbols are set forth to provide a thorough understanding of the present invention. In some instances, the nomenclature and symbols may imply implementation details that are not required to practice the present invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. A signal is said to be "asserted" when a signal line is driven to a particular logic state (or charged or discharged to a particular logic state) to indicate a particular condition. Conversely, a signal is said to be "deasserted" to indicate that the signal line is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. Additionally, the prefix symbol "/" attached to signal names indicates that the signal is an active low signal (i.e., the asserted state is a logic low state). A line over a signal name (e.g., '<signal name>') is also used to indicate an active low signal. Active low signals may be changed to active high signals and vice-versa as is generally known in the art.

In embodiments of the present invention, a CAM array is segmented into two or more array segments, including a primary array segment and at least one cascaded array segment. During a search operation, a comparand value is driven onto compare signal lines within the primary segment. A cascade register is coupled to the compare signal lines to receive the comparand value, and stores the comparand value in response to a control signal. The cascade register then outputs the comparand value to the cascaded array segment. Additional cascade registers may similarly be cascaded from the first cascaded array segment to enable further propagation of the comparand value to additional cascaded array segments. By this arrangement, search operations may be executed in the cascaded array by starting with a search of the primary array segment, then progressing in sequence through each of the cascaded array segments. By limiting the size of each array segment as necessary to achieve a desired segment search time, search operations within the cascaded array may be pipelined such that, after a first comparand value has been searched within the primary array segment in a first compare cycle, a second compare cycle may be executed within the primary array segment concurrently with a search of the first comparand value within the cascaded array segment. From the standpoint of a search requester, a new search may be initiated during each compare cycle of the CAM device, the depth of the search pipeline bearing only on the latency of the search result. Thus, by shortening the search cycle time through array segmentation, and pipelining the search operation within the cascaded segments, an overall higher search throughput may be achieved within the cascaded array as compared with searching in an unsegmented array having the same storage capacity. Also, in contrast to CAM devices which include multiple CAM blocks and corresponding, replicated comparand generators, a relatively small die area is consumed by the cascade registers provided to drive the compare signal lines of each cascaded array segment.

Figure 2:
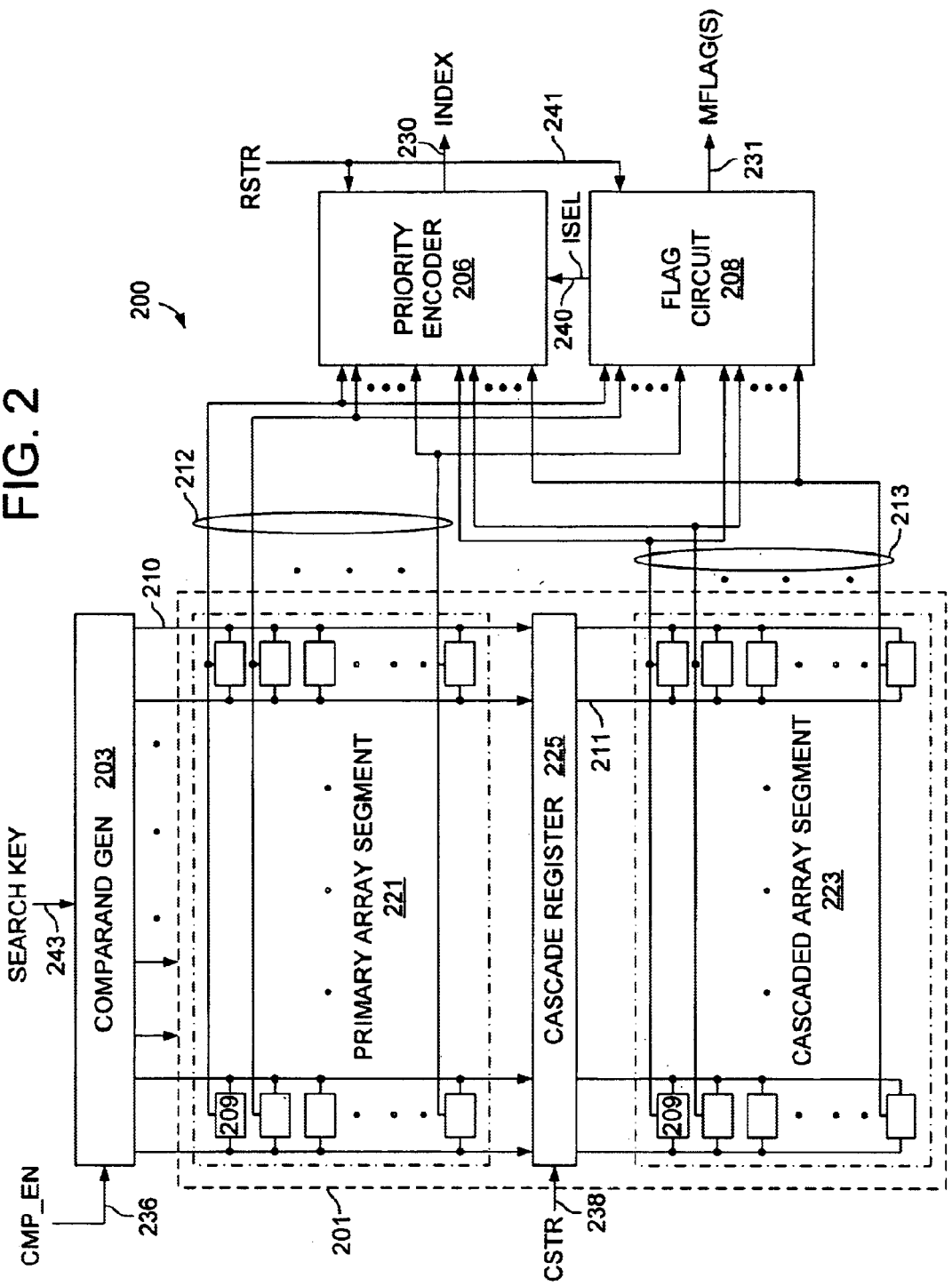
FIG. 2 illustrates a CAM device according to an embodiment of the invention.

FIG. 2 illustrates a CAM device 200 according to an embodiment of the invention. The CAM device 200 includes a cascaded CAM array 201, comparand generator 203, priority encoder 206 and flag circuit 208. The cascaded CAM array 201 includes a plurality of CAM cells 209 disposed in rows and columns within two array segments: a primary array segment 221 and a cascaded array segment 223. A plurality of compare signal lines 210 extend from the comparand generator 203 through the primary array segment 221 to a cascade register 225. The cascade register is depicted in FIG. 2 as being part of the CAM array 201, but may alternatively be a distinct circuit. The compare signal lines 210 are referred to herein as primary compare lines to distinguish them from the compare signal lines 211 (i.e., cascaded compare lines) which extend from the cascade register 225 through the cascaded array segment 223.

The cascade register 225 includes a plurality of storage elements to store a comparand value received via the primary compare lines 210 and to output the comparand value onto the cascaded compare lines 211. In the embodiment of FIG. 2, a compare enable signal 236 (CMP_EN) is input to the comparand generator 203 to enable a comparand value to be driven onto the primary compare lines 210, and a cascade strobe signal (CSTR) is asserted at a strobe input of the cascade register 225 a short while later to enable the comparand value, now having settled on the primary compare lines 210, to be stored within the cascade register 225. Thus, the comparand value is compared to contents within the different segments of the CAM array in cascaded order; first being compared to contents of the primary array segment, and then to contents of the cascaded array segment. In alternative embodiments, one or more additional cascaded segments may follow cascaded segment 223, with the comparand value being compared to contents within each subsequent cascaded array segment in turn.

Figure 3:
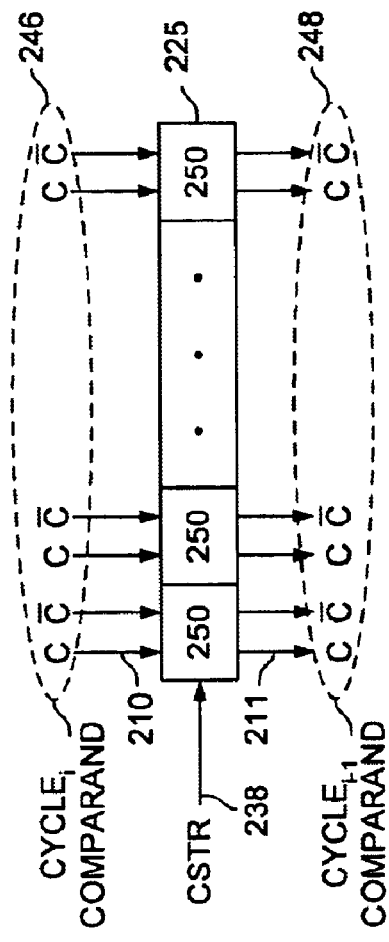
FIG. 3 illustrates the operation of an exemplary cascade register.
Figure 4:
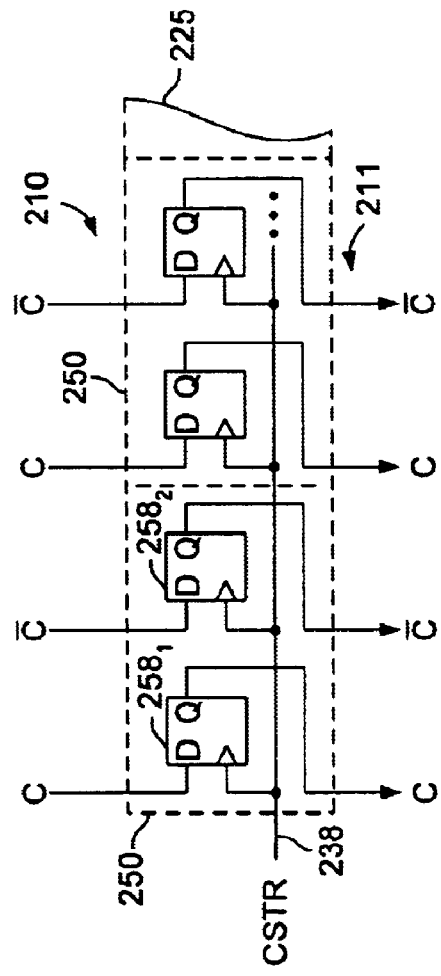
FIG. 4 illustrates the architecture of an exemplary cascade register.

FIGS. 3 and 4 illustrate the operation and architecture of a cascade register 225 according to an embodiment of the invention. Referring first to FIG. 3, complementary pairs of comparand signals (C and /C), each pair representing a bit of a first comparand value 246, are input to respective storage elements 250 within the cascade register 225 via primary compare lines 210, while a second comparand value is simultaneously output from the storage elements 250 on cascaded compare lines 211. By this arrangement, a search operation may be executed in the primary array segment simultaneously with execution of a previously requested search operation in the cascaded array segment. When the cascade strobe signal 238 is asserted, the comparand value 246 is loaded into the cascade register 225 and thereafter output to the cascaded array segment via cascaded compare lines 211. A new comparand value is then output to the primary compare lines and settles at the inputs of storage elements 250 prior to the next assertion of the cascade strobe signal 238.

FIG. 4 illustrates the structure of the storage elements 250 within the cascade register 225 according to one embodiment. Two primary compare lines and two cascaded compare lines are coupled to each storage element 250 to enable differential transmission of the corresponding comparand bit. Accordingly, each storage element 250 includes a pair of storage elements $258_1$, $258_2$ having inputs coupled to corresponding pair of primary compare lines and outputs coupled to corresponding pair of cascaded compare lines. In the embodiment of FIG. 4, the storage elements 250 are edge-triggered elements (e.g., flip-flops) and therefore register the incoming comparand value 246 in response to an edge of the cascade strobe signal 238. In an alternative embodiment, the storage elements 250 are latch elements which pass the comparand value from input to output (i.e., from a primary compare line to the corresponding cascaded compare line) until the cascade strobe signal 238 is asserted to latch the output value.

In one embodiment the primary compare lines 210 are terminated at high impedance inputs of the storage elements 250, thereby providing electrical isolation between the primary compare lines 210 and cascaded compare lines 211. Thus, referring again to FIG. 2, the CAM cells within the cascaded array segment 223 do not contribute (or contribute negligibly) to the capacitive loading of the primary compare lines 210, and, conversely, the CAM cells within the primary array segment 221 do not contribute (or contribute negligibly) to the capacitive loading of the cascaded compare lines 211. Also, the signal flight distance on each compare signal line is halved by the segmentation of a single compare signal line into separate primary and cascaded compare lines. Thus, the net effect of segmenting the CAM array 201 and interposing the cascade register 225 between the compare signal lines of the array segments is to significantly reduce both the signal flight distance and the charge transfer required to stabilize a signal along the length of a given compare signal line. Accordingly, compare operations within a given segment of the array 201 may be performed significantly faster than in an unsegmented version of the array 201. Also, the cascaded nature of compare operations within the CAM array 201 frees the primary array segment 221 to begin a new search cycle as the preceding search operation is being performed within the cascaded segment 223. That is, search operations may be pipelined between the primary and cascaded array segments such that a newly received comparand value is searched within the primary array segment 221 while a previously received comparand value is searched within the cascaded array. Accordingly, a new search operation may be initiated within the segmented CAM array 201 after completion of each compare cycle within the primary array segment, thereby permitting a throughput of one search operation per segment compare cycle, the compare cycle time being shortened by array segmentation.

Still referring to FIG. 2, each row of CAM cells within the primary array segment 221 is coupled to the priority encoder 206 and the flag circuit 208 via a respective primary match line 212, and each row of CAM cells within the cascaded array segment 223 is coupled to the priority encoder 206 and the flag circuit 208 via a respective cascaded match line 213. The flag circuit 208 generates a device match flag 231 (MFLAG) and an index select signal 240 (ISEL) according to the match results from the primary and cascaded array segments 221 and 223. The flag circuit 208 may additionally generate a multiple match flag signal if multiple matches are indicated by either the primary or cascaded array segments, or if both the primary and cascaded array segments indicate a match condition.

The priority encoder 206 generates a device index 230 according to the match results from the primary and cascaded array segments 221, 223, and the index select signal 240 from the flag circuit. The device index corresponds to an address within the CAM array 201 of a highest priority value determined to match a comparand value (i.e., a highest priority match) and includes a segment address component and row address component. The segment address component identifies the array segment containing the highest priority match, and the row address component corresponds to the row (within a segment) containing the highest priority match. In one embodiment, the priority encoder 206 generates respective primary and cascaded segment indices according to the match results for the corresponding array segments and selects one of the segment indices, according to the index select signal 240, to be the row address component of the device index 230. The index select signal 240 is itself output, in complemented or uncomplemented form, as the segment address component of the device index 230. The segment address component of the device index 230 is referred to in embodiments described herein as the most significant bit (or bits) of the device index 230 and the row address component as the less significant bits of the device index, but this order of significance may be reversed in alternative embodiments. In one embodiment, the priority encoder 206 generates the device index according to a predetermined priority policy (e.g., lowest numbered match address has highest priority, highest numbered match address has highest priority, etc.). In an alternative embodiment, the priority encoder generates the device index according to programmable priority values associated with each entry within the CAM array 201.

Due to the pipelined search operations within the primary and cascaded array segments, the match signals generated by the primary and cascaded array segments for a given comparand value are generated at different times. That is, the match signals from the cascaded match lines trail the match signals from the primary match lines according to the time delay between assertion of the compare enable signal and the cascade strobe signal. In one embodiment, the priority encoder and flag circuit include storage registers (or latches) to store the primary index and primary segment flag, respectively, so that those values remain available until the corresponding cascaded index and cascaded segment flag are generated. In the embodiment of FIG. 2, for example, a result strobe signal is input to the priority encoder 206 and the flag circuit 208 to control the storage of the primary index and primary segment flag from one compare cycle to the next.

Figure 5:
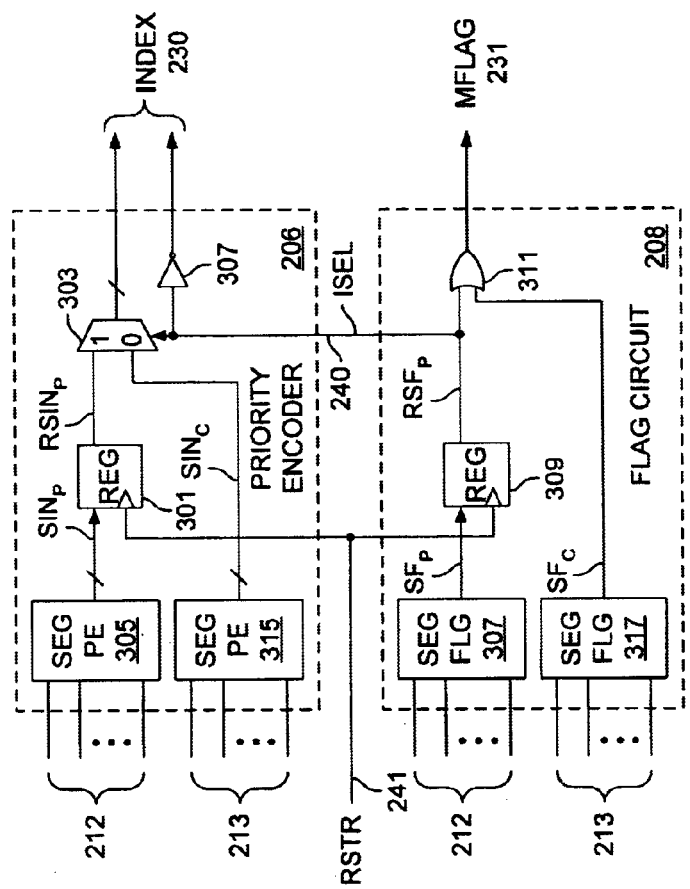
FIG. 5 illustrates the priority encoder and flag circuit of FIG. 2 according to an embodiment of the invention.

FIG. 5 illustrates the priority encoder 206 and flag circuit 208 of FIG. 2 according to one embodiment. The priority encoder 206 includes a primary segment priority encoder 305 coupled to the primary match lines 212 (i.e., the match lines from the primary array segment), and a cascaded segment priority encoder 315 coupled to the cascaded match lines 213 (i.e., the match lines from the cascaded array segment). The primary segment priority encoder 305 generates a primary segment index, $SIN_P$ (referred to herein as a primary index), according to the state of the primary match lines 312 and the cascaded segment priority encoder 315 generates a cascaded segment index, $SIN_C$ (referred to herein as a cascaded index), according to the state of the cascaded match lines 213. The primary index, $SIN_P$, is stored within an index register 301 in response to the result strobe signal 241. By this operation, the primary index remains available, as a registered segment index, $RSIN_P$, during the subsequent pipeline stage when the corresponding cascaded segment index, $SIN_C$, becomes valid. The registered segment index and the cascaded segment index are provided to respective inputs of a multiplexer 303 which selects between the two indices according to the index select signal 240 from the flag circuit 208.

The flag circuit 208 includes a primary segment flag circuit 307 to generate a primary segment flag, $SF_P$, according to the state of the primary match lines 212, and a cascaded segment flag circuit 317 to generate a cascaded segment flag, $SF_C$, according to the state of cascaded match lines 213. The primary segment flag, $SF_P$, is stored within a flag register 309 in response to the result strobe signal, RSTR and therefore remains available, as a registered segment flag ($RSF_P$), during the subsequent pipeline stage when the corresponding cascaded segment flag, $SF_C$, becomes valid. The registered segment flag and cascaded segment flag are ORed with one another in OR gate 311 to generate the device match flag 231. The registered and cascaded segment flags may additionally be used to generate a device multiple-match flag, for example, by ANDing the registered and cascaded segment flags with one another, then ORing the AND result with segment-multiple-match flags generated by the segment flag circuits 307 and 317.

In the embodiment of FIG. 5, the registered segment flag, $RSF_P$, constitutes the index select signal 240 and is provided to a select input of the multiplexer 303. Accordingly, if a match is detected in the primary array segment, the index select signal 240 goes high to select the corresponding primary index (i.e., the registered segment index, $RSIN_P$) to be the row address component of the device index 230. Conversely, if no match is detected in the primary array segment, the index select signal 240 goes low to select the cascaded index, $SIN_C$, to be the row address component of the device index 230. The index select signal 240 is complemented by inverter 307 to generate the segment address component of the device index 230. Thus, if the primary index is selected as the row address component of the device index 230, the segment address is driven low to identify the primary array segment as the source of the highest priority match. Conversely, if the cascaded index is selected as the row address component of the device index 230, the segment address is driven high to identify the cascaded array segment as the source of the highest priority match. Note that the index encoding policy thus described assigns a higher priority to lower numbered addresses (i.e., giving priority to the primary segment array over the cascaded segment array if matches are detected within both arrays). In alternative embodiments, different encoding policies may be used including, for example, assigning higher priority to higher numbered addresses or enabling priorities to be dynamically assigned. In an embodiment that assigns higher priority to higher numbered addresses, the cascaded segment flag signal, $SF_C$, may be used as the index select signal 240 and output without inversion as the segment address component of the device index 230.

Figure 6:
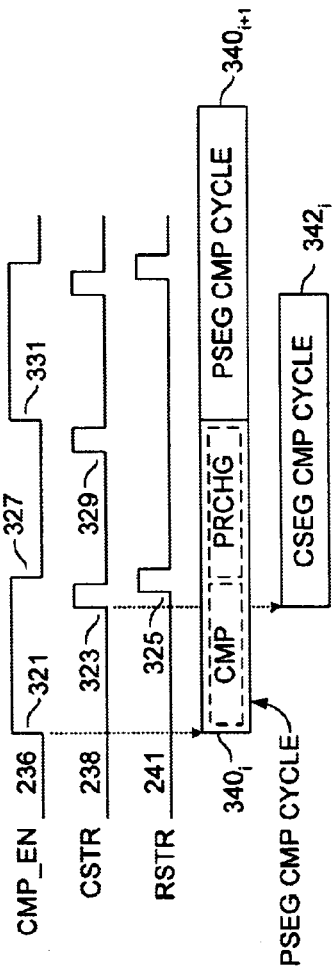
FIG. 6 illustrates the relative timing of the compare enable signal, cascade strobe signal and result strobe signal of FIG. 2.

FIG. 6 illustrates the relative timing of the compare enable signal 236 (CMP_EN), cascade strobe signal 238 (CSTR) and result strobe signal 241 (RSTR) of FIG. 2. Initially, at 321, the compare enable signal 236 goes high to initiate a first compare cycle $340_i$ within the primary array segment. At 323, shortly before the compare enable signal 236 goes low, the cascade strobe signal 238 is asserted to strobe a comparand value from the primary compare lines into the cascade register. Thereafter, the cascade register outputs the comparand value to the cascaded array segment to initiate a compare cycle $342_i$ within the cascaded array segment. At 327, the compare enable signal 236 is deasserted to enable the primary match lines to be precharged in preparation for the next compare cycle. In one embodiment, precharging of the primary match lines is achieved by driving the primary compare lines to a predetermined state (e.g., non-differential states in which all the lines are high or all the lines are low). Thus, a compare cycle $342_i$ is begun in the cascaded array segment while the corresponding compare cycle $340_i$ is concluded in the primary array segment. The result strobe signal 241 is asserted at 325, prior to deassertion of the compare enable signal 236, to strobe the primary index and primary segment flag into the index and flag registers, respectively (e.g., registers 301 and 309 of FIG. 5, referred to collectively herein as result registers). By this arrangement, the primary index and primary segment flag generated during primary compare cycle $340_i$ are synchronized with the cascaded index and cascaded segment flag generated during cascaded compare cycle $342_i$. That is, indices and flags corresponding to both array segments are available to generate a device index and device match flag for a given comparand value.

Shortly before the reassertion of the compare enable signal at 331 to begin the next primary compare cycle, $340_{i+1}$, the cascade strobe signal 238 is asserted as shown at 329 to load the predetermined state of the primary compare lines into the cascade register, and thereby enable a precharge operation within the cascaded array segment. Thus, when new compare cycle is begun within the primary array segment at 331, the cascaded array segment is precharged in preparation for the next cascaded compare operation.

Reflecting on the diagram of FIG. 6, it can be seen that each compare cycle within a given array segment includes a compare phase and a precharge phase as shown by the dashed boxes within primary compare cycle $340_i$. For example, assertion of the compare enable signal 236 at 321 begins the compare phase of primary compare cycle $340i$, and deassertion of the compare enable signal at 327 concludes the compare phase and begins the precharge phase of the cycle $340i$. Similarly, assertion of the cascade strobe signal 238 at 323 begins the compare phase of cascaded compare cycle $342i$, and re-assertion of the cascade strobe signal at 329 concludes the compare phase and begins the precharge phase of the cascaded compare cycle $342_i$. Thus, the compare phase of a given compare cycle within the one array segment is executed concurrently (i.e., at least partly overlapping in time) with the precharge phase of the compare cycle (i.e., same comparand value, same overarching search operation) in the alternate array segment, thereby achieving a pipelining of compare cycles within the array segments. Because the results of a given primary compare cycle are registered for combination with the results of the corresponding cascaded compare cycle, a new primary compare cycle may be initiated within the primary array segment immediately after completion of the prior primary compare cycle (i.e., as shown by $340_i$ and $340_{i+1}$). Consequently, a new search operation may be initiated in each successive primary compare cycle.

Figure 7:
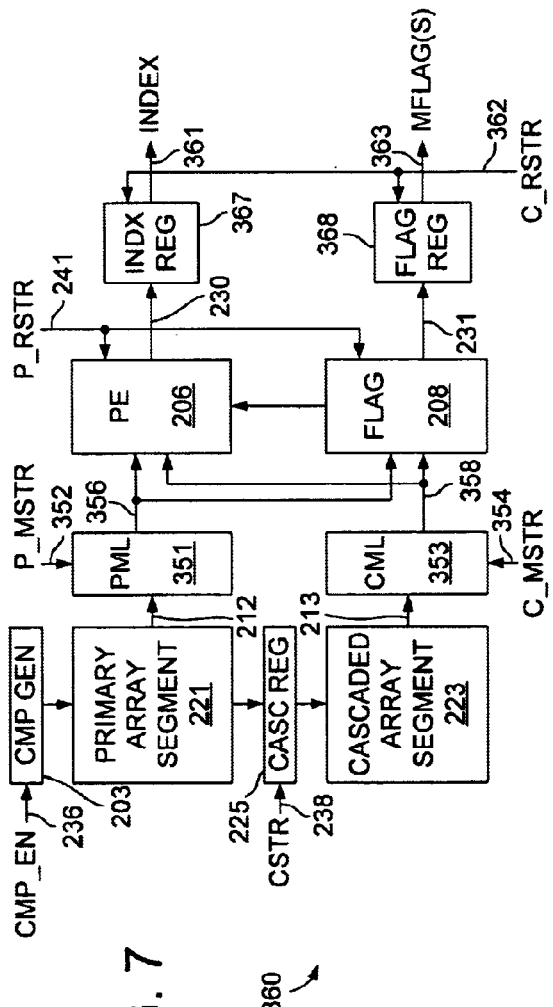
FIG. 7 illustrates a CAM device according to alternative embodiment of the invention.

FIG. 7 illustrates a CAM device 360 according to an alternative embodiment of the invention. The CAM device 360 includes a comparand generator 203, primary array segment 221, cascaded array segment 223, cascade register 225, priority encoder 206 and flag circuit 208 all of which operate generally as described in reference to FIG. 2, and additionally includes respective match latch circuits 351 and 353 to latch the primary and cascaded match signals (212 and 213) in response to primary and cascaded match strobe signals 352 and 354, respectively (P_MSTR and C_MSTR). Also, an additional set of index and flag registers 367 and 368 (i.e., in addition to the index and flag registers, within the priority encoder 206 and flag circuit 208, respectively) are provided to store the device index 230 and device flag 231 in response to a cascaded result strobe signal 362 (C_RSTR).

Figure 8:
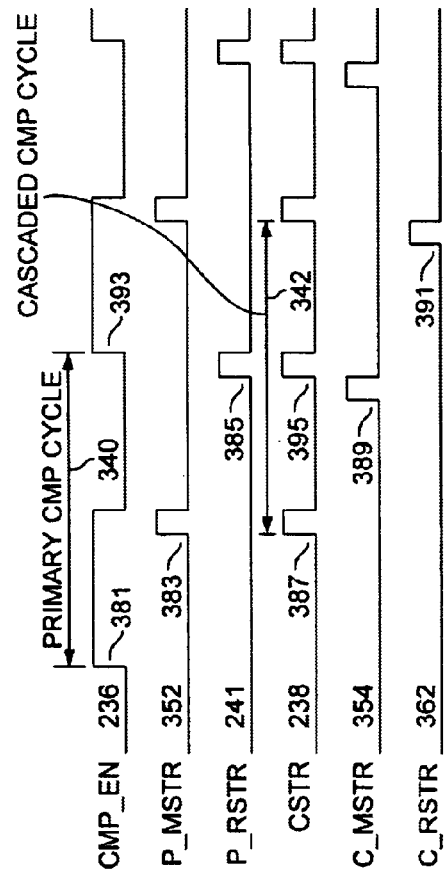
FIG. 8 illustrates the relative timing of the compare enable signal, match strobe signals, cascade strobe signal and result strobe signals of FIG. 7.

FIG. 8 illustrates the relative timing of the compare enable signal 236 (CMP_EN), match strobe signals 352 and 354, cascade strobe signal 238 and result strobe signals 241 and 362 of FIG. 7. Initially, at 381, the compare enable signal 236 is asserted to begin the compare phase of a first primary compare cycle 340. At 383, shortly before the compare enable signal 236 is deasserted, the primary match strobe signal 352 is asserted to latch (or register) the states of the primary match lines within the primary match latch (i.e., element 351 of FIG. 7). By this operation, the match signals generated by the primary array segment remain available after the compare enable signal 236 is deasserted, enabling the primary match lines to be precharged in the precharge phase of the primary compare cycle 340 without loss of match information. At 385, after the output of the primary match latch has settled, the primary result strobe signal 241 is asserted to store the primary flag and primary index. Thus, the primary flag and primary index generated in response to the compare enable signal assertion at 381 are registered and remain available after the compare enable signal 236 is reasserted at 393 to start the next primary compare cycle.

A cascaded compare cycle 342 is initiated by the assertion of the cascade strobe signal 238 at 387, shortly before the compare enable signal 236 is deasserted. The cascade strobe signal 238 strobes the comparand value from the primary compare lines into the cascade register and thus initiates the compare phase of the cascaded compare cycle 342. At 395, the cascade strobe signal 238 is reasserted to load the cascade register with the predetermined state of the primary compare lines (e.g., all lines at logic low levels), concluding the compare phase and beginning the precharge phase of the cascaded compare cycle 342. At 389, shortly before the cascade strobe signal is reasserted, the cascaded match strobe signal 354 is asserted to register (or latch) the state of the cascaded match lines within the cascaded match latch. By this operation, the match signals generated by the cascaded array segment remain available after the assertion of the cascaded strobe signal at 395. Accordingly, after the cascaded match strobe signal 354 is asserted at 389 and before assertion of the cascaded result strobe signal 362 at 391, the cascaded flag and cascaded index are available, along with the registered primary flag and registered primary index, to generate the device index and device flag (i.e., signals 230 and 231, respectively, of FIG. 7). The cascaded result strobe signal 362 is asserted at 391 to strobe the device index and device flag into the index and flag registers, respectively (i.e., registers 367 and 368 of FIG. 7), concluding the overall search operation within the segmented array.

Figure 9:
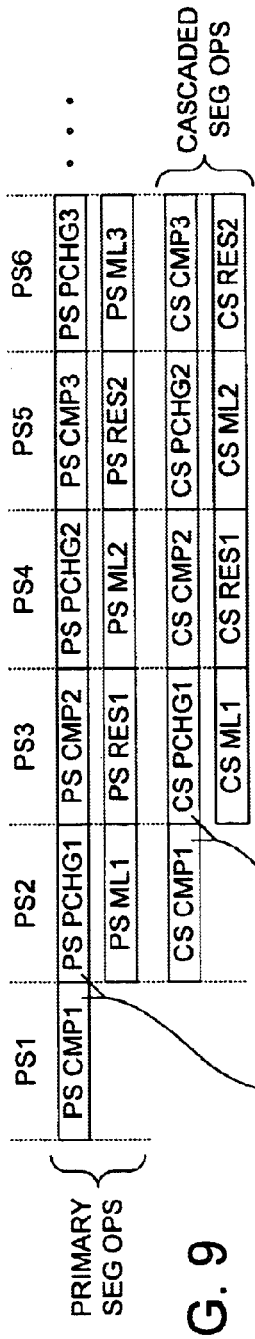
FIG. 9 illustrates the manner in which compare, precharge, match latch and result generation operations are pipelined within the CAM device of FIG. 7.

FIG. 9 illustrates the manner in which compare, precharge, match latch and result generation operations are pipelined within the CAM device of FIG. 7. During a first pipeline stage, PS1, the compare phase (PS CMP1) of a first primary compare cycle $340_1$ is initiated in response to assertion of the compare enable signal. In the succeeding pipeline stage, PS2, the precharge phase (PS PCHG) of the primary compare cycle 340, is executed in response to deassertion of the compare enable signal, and the primary match line states resulting from the preceding compare phase are latched in the primary match latch (PS ML1) in response to the primary match strobe signal. Also during pipeline stage PS2, the compare phase (CS CMP1) of a first cascaded compare cycle $342_1$ is initiated in response to the cascade strobe signal. In pipeline stage, PS3, the segment index and segment flag generated by the first primary compare cycle $340_1$ are registered (PS RES1) in response to the primary result strobe signal, and the compare phase (PS CMP2), of a second primary compare cycle $340_2$ is initiated in response to reassertion of the compare enable signal. Also, the precharge phase (CS PCHG1) of the first cascaded compare cycle $342_1$ is initiated in response to assertion of the cascade strobe signal, and the cascaded match line states resulting from the preceding cascade compare phase are latched (or registered) in the cascaded match latch (CS ML1). During pipeline stage PS4, the operations of pipeline stage 2 are repeated for the second primary and cascaded compare cycles, $340_2$ and $342_2$. Also, the segment index and segment flag generated in response to the first cascaded compare cycle $342_1$ are registered (CS RES1) in response to the cascaded result strobe signal, thereby concluding the search operation constituted by the first primary and cascaded compare cycles $340_1$ and $342_1$. The operations in pipeline stage PS5 mirror the operations in pipeline stage PS3, but are carried out as part of different compare cycles (i.e., start of a third primary compare cycle, and conclusion of the second cascaded compare cycle $342_2$), and the operations in pipeline stage PS6 similarly mirror the operations in pipeline stage PS4, with the pipeline stages that follow thereafter also mirroring the operations within pipeline stages 3 and 4 but for subsequent primary and cascaded compare cycles.

Still referring to FIG. 9, it can be seen that the primary and cascaded compare cycles, 340 and 342, are pipelined with the precharge phase of the primary compare cycles occurring concurrently with the compare phase of the cascaded compare cycles. Accordingly, a primary segment index and segment flag (i.e., the primary segment results) become available and are registered in the middle of a corresponding cascaded compare cycle, and the cascaded segment index and segment flag become available for generation of a device index and device flag in the middle of the subsequent primary compare cycle. In an alternative embodiment, the cascaded compare operation for a given comparand value may be carried out concurrently with the primary compare operation for a subsequent comparand value. The primary and cascaded precharge operations, primary and cascaded match latch operations and primary and cascaded result registration operations may similarly be executed concurrently, but for different comparand values. In such an embodiment, a single match strobe signal may be used to latch (or register) the primary and cascaded match line states, and a single result strobe signal may be used to register (or latch) the primary and cascaded match results. Also, the cascade register may be loaded in response to each transition of the compare enable signal so that a separate cascade strobe signal is unnecessary.

Figure 10:
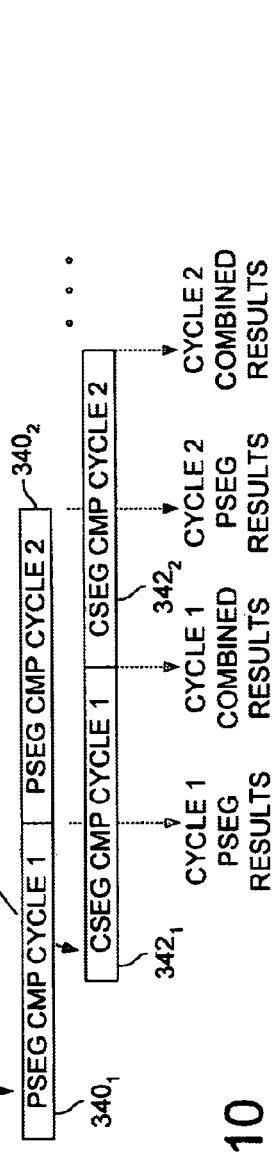
FIG. 10 illustrates a cascaded CAM array according to an embodiment having a primary array segment and an arbitrary number, N, of cascaded array segments.

FIG. 10 illustrates a cascaded CAM array 420 according to an embodiment having a primary array segment 221 and an arbitrary number of cascaded array segments, $223_1$–$223_N$. A comparand generator 203 is provided to output a comparand value onto the compare signal lines of a primary array segment 221, with the comparand value being stored within a first cascaded array register $225_1$ (C1 CREG) in response to a first cascade strobe signal $238_1$ (C1_CSTR), and with each cascaded register thereafter (i.e., $225_2$–$225_N$) being coupled to receive the comparand value from the compare signal lines of the preceding cascaded array segment. In the embodiment of FIG. 10, respective cascade strobe signals $238_1$–$238_N$(C1_CSTR, C2_CSTR, . . . , CN_CSTR) are input to the cascade registers $225_1$–$225_N$, though a single cascade strobe signal may alternatively be supplied to all the cascade registers.

Figure 11:
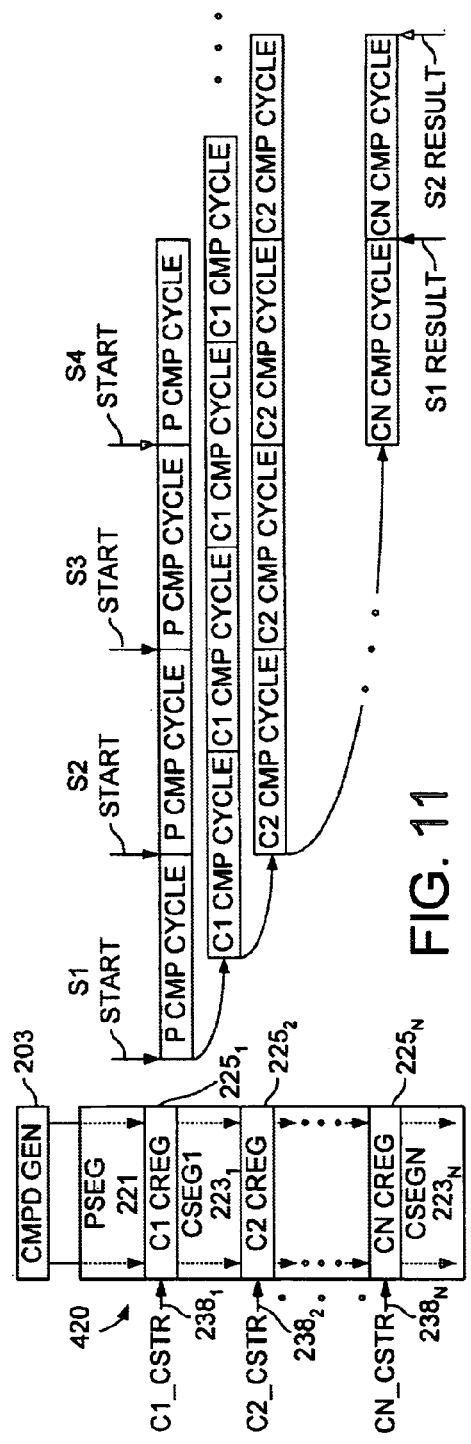
FIG. 11 illustrates a compare cycle pipeline for the cascaded CAM array of FIG. 10.

FIG. 11 illustrates a compare cycle pipeline for the cascaded CAM array of FIG. 10. As shown, a primary compare cycle (P CMP CYCLE) is executed to initiate a first search operation, S1, and subsequent search operations, S2, S3, S4, and so forth, are initiated at the conclusion of the primary compare cycle for the previous search operation. Thus, the search operation throughput is determined by the relatively fast compare cycle time within a single segment of the cascaded CAM array 420. Referring to the first search operation, S1, a cascaded compare cycle (C1 CMP CYCLE) is initiated in the first cascaded array segment after completion of the compare phase of the primary compare cycle, and a subsequent cascaded compare cycle (C2 CMP CYCLE . . . CN CMP CYCLE) is initiated in each succeeding cascaded array segment after completion of the compare phase of the preceding cascaded compare cycle. Accordingly, a combined search result for the cascaded array is generated at the conclusion of the Nth cascaded compare cycle such that the overall latency between the initiation of a given search operation and the generation of the search result is the compare cycle time for a given segment of the cascaded array multiplied by the number of cascaded segments, plus the time required to complete the compare phase of the initial primary compare cycle.

Figure 12:
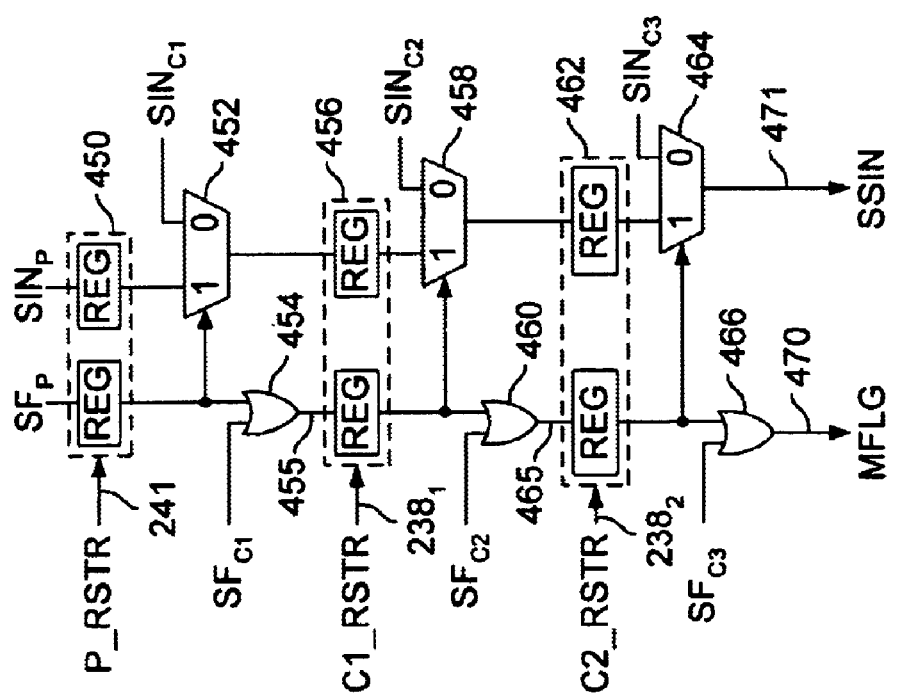
FIG. 12 illustrates an embodiment of a priority encoder and flag circuit that may be used to generate a selected segment index and device flag for a cascaded CAM array having four array segments.

FIG. 12 illustrates an embodiment of a priority encoder and flag circuit that may be used to generate a selected segment index 471 (SSIN) and match flag 470 for a cascaded CAM array having a primary array segment and three cascaded array segments. A primary flag, $SF_P$, and primary index, $SIN_P$, are generated during a primary compare cycle as described above and stored in a register 450 in response to a primary result strobe signal 241 (P_RSTR). A subsequent compare cycle within the first cascaded array yields a first cascaded index, $SIN_{C1}$, and segment flag, $SF_{C1}$. The first cascaded segment flag, $SF_{C1}$, is ORed with the registered primary segment flag in OR gate 454 to produce a first composite match flag 455 which is supplied to an input of a second-stage register 456. The registered primary segment flag is also supplied to a select input of a multiplexer 452 to select either the registered primary segment index or the first cascaded segment index, $SIN_{C1}$, to be output to the second-stage register 456. The first composite match flag 455 and the selected index are stored in the second-stage register 456 in response to a result strobe signal $238_1$ for the first cascaded array segment (C1_RSTR). Thus, after assertion of the result strobe signal $238_1$, the second stage register 456 contains (1) an ORed combination of the primary segment flag and first cascaded segment flag (i.e., composite match flag 455); and (2) either the primary index or the first cascaded index depending upon whether a match was detected in the primary array segment.

A subsequent compare cycle within the second cascaded array segment yields a second cascaded index, $SIN_{C2}$, and segment flag, $SF_{C2}$. The second cascaded segment flag is ORed with the registered composite match flag in OR gate 460 to generate a second composite match flag 465, the composite match flag 465 being supplied to an input of a third-stage register 462. The registered composite match flag is supplied to a select input of a multiplexer 464 to select either the index from the second-stage register 456 or the second cascaded index, $SIN_{C2}$, to be output to a third-stage register 462. The composite match flag 465 and the selected index are stored in the third-stage register 462 in response to a result strobe signal $238_2$ for the second cascaded array segment (C2_RSTR). Thus, after assertion of the result strobe signal $238_2$, the third-stage register 462 contains (1) an ORed combination of the primary, first cascaded and second cascaded segment flags (i.e., composite match flag 465); and (2) either the primary index, second cascaded index or third cascaded index depending on the match results for the primary and first cascaded array segments.

subsequent compare cycle within the third cascaded array segment yields a third cascaded index, $SIN_{C3}$, and segment flag, $SF_{C3}$. The composite match flag from the third-stage register 462 is ORed with the third cascaded segment flag in OR gate 466 to generate the device flag 470 (MFLG). Thus, the device flag 470 reflects a logical OR combination of successively generated segment flags and therefore is asserted if a match has been detected in any segments of the cascaded array. The composite match flag from the third-stage register 462 is also supplied to an input of a multiplexer 464 to select either the index from the third-stage register 462 or the third cascaded index, $SIN_{C3}$, to be output as the selected segment index 471. In one embodiment, the selected segment index 471 forms the row address of a device index. The following logic table illustrates the overall operation of the logic circuit of FIG. 12:

| $SF_P$ | $SF_{C1}$ | $SF_{C2}$ | $SF_{C3}$ | MFLG | SSIN |
|---|---|---|---|---|---|
| 0 | 0 | 0 | 0 | 0 | $SIN_{C3}$ |
| 1 | X | X | X | 1 | $SIN_P$ |
| 0 | 1 | X | X | 1 | $SIN_{C1}$ |
| 0 | 0 | 1 | X | 1 | $SIN_{C2}$ |
| 0 | 0 | 0 | 1 | 1 | $SIN_{C3}$ |

Other priority encoding policies may be used to yield different selected segment indices in alternative embodiments.

Figure 13:
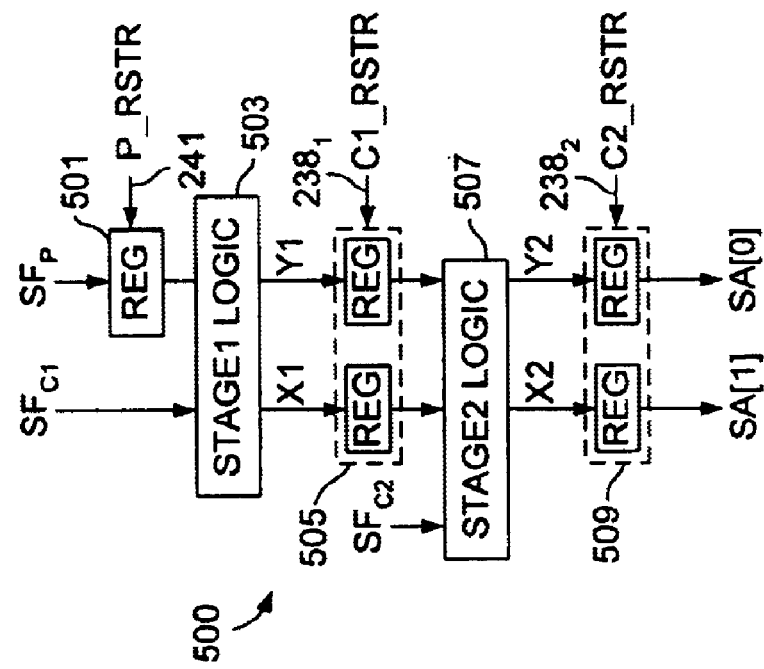
FIG. 13 illustrates an embodiment of a segment address generator that may be used with the priority encoder and flag circuit of FIG. 12.

FIG. 13 illustrates an embodiment of a segment address generator 500 that may be used in combination with the priority encoder and flag circuit of FIG. 12. That is, the segment address generator 500 generates a segment address 518 which, together with the selected segment index 471 output by the logic circuit of FIG. 12, form a device index that uniquely identifies a segment within a four-segment CAM array and row of CAM cells within the identified segment.

In one embodiment, segment flag signals SFP, SFC1, SFC2 and SFC3 are generated in successive, pipelined compare cycles by respective segment flag circuits. The primary segment flag, $SF_P$, is stored in register 505 in response to the primary result strobe signal 241, and is therefore available for input to a first stage logic circuit 503 along with the first cascaded segment flag, $SF_{C1}$. The first stage logic circuit 503 generates a first-stage segment address [X1, Y1] according to the following logic table:

| $SF_P$ | $SF_{C1}$ | X1 | Y1 |
|---|---|---|---|
| 0 | 0 | 1 | 1 |
| 0 | 1 | 0 | 1 |
| 1 | X | 0 | 0 |

The first-stage segment address is stored in register 505 in response to the first cascaded result strobe signal $238_1$, and is therefore available for input to a second stage logic circuit 507 along with the second cascaded segment flag, $SF_{C2}$. The second stage logic circuit 507 generates a final segment address, SA[1:0] according to the following logic table:

| X1 | Y1 | $SF_{C2}$ | SA[1] | SA[0] |
|---|---|---|---|---|
| 0 | 0 | X | 0 | 0 |
| 0 | 1 | X | 0 | 1 |
| 1 | 1 | 0 | 1 | 1 |
| 1 | 1 | 1 | 1 | 0 |

The segment address is registered in register 509 in response to the second cascaded result strobe signal, $238_2$ and made available thereafter as the segment address component of the device index.

Figure 14:
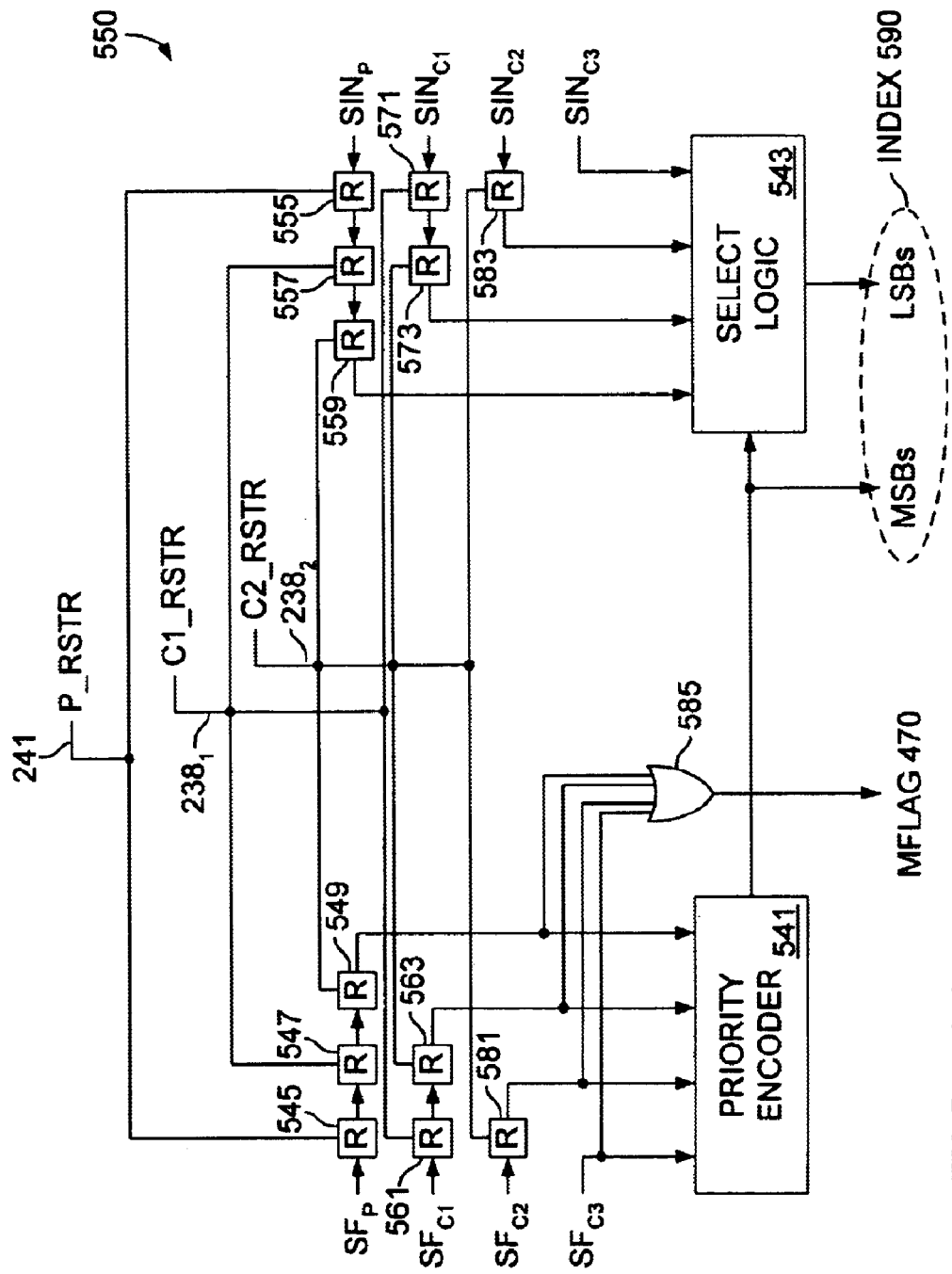
FIG. 14 illustrates a device flag and index generating circuit that may be used as an alternative to the circuits of FIGS. 12 and 13.

FIG. 14 illustrates a device flag and index generating circuit 550 that may be used as an alternative to the circuits described in reference to FIGS. 12 and 13. A set of segment flags ($SF_P$, $SF_{C1}$, $SF_{C2}$, $SF_{C3}$) and segment indices ($SIN_P$, $SIN_{C1}$, $SIN_{C2}$, $SIN_{C3}$) are generated d sequence of compare cycles within a quad-segmented array (i.e., primary array segment and three cascaded array segments), as described in reference to FIGS. 12 and 13. A result strobe signal for each corresponding array segment is asserted in response to each completed compare cycle to register the corresponding segment flag and segment index. Thus, after completion of a primary compare cycle, a primary result strobe signal 241 is asserted to store the primary segment flag, $SF_P$, and primary index, $SIN_P$, in registers 545 and 555, respectively. After completion of a first cascaded compare cycle, a first cascaded strobe signal $238_1$ is asserted to store the first cascaded segment flag, $SF_{C1}$, and first cascaded index, $SIN_{C1}$ in registers 561 and 571, respectively. The first cascaded strobe signal $238_1$ is additionally used to strobe the primary results (i.e., primary index and primary segment flag) from registers 545 and 555 into registers 547 and 557, thereby freeing registers 545 and 555 to store the next primary result. After completion of a second cascaded compare cycle, a second cascaded strobe signal $238_2$ is asserted to store the second cascaded flag, $SF_{C2}$, and second cascaded index, $SIN_{C2}$, in registers 581 and 583, respectively. The second cascaded strobe signal $238_2$ is additionally used to shift the primary results forward to registers 549 and 559, and the first cascaded results forward to registers 563 and 573, thereby freeing all predecessor registers to store subsequently generated results. At this point, the primary segment flag, first cascaded segment flag and second cascaded segment flag are supplied from registers 549, 563 and 581, respectively, to a priority encoder 541 and to a logic OR gate 585, and the primary index, first cascaded index and second cascaded index are supplied from registers 559, 573 and 583, respectively, to a select logic circuit 543. Thus, when the third cascaded segment flag, $SF_{C3}$, and third cascaded index, $SIN_{C3}$, become available (i.e., in response to a third cascaded compare cycle), all four segment flags for the CAM array are input to the priority encoder 541 and to logic gate 585, and all four segment indices for the CAM array are input to the select logic circuit 543. The segment flags are ORed in the logic gate 585 to produce the device flag 470. Accordingly, if any one of the segment flags indicates a match, the device flag 470 is asserted. The priority encoder 541 generates the most significant bits (i.e., segment address component) of the device index 590, according to a predetermined policy. For example, in an embodiment in which matches in the primary segment are given priority over matches in the cascaded array segments, and each cascaded array segment in turn takes priority over a subsequent cascaded array segment, the priority encoder 541 operates according to the following logic table to generate the most significant bits of the device index:

| $SF_P$ | $SF_{C1}$ | $SF_{C2}$ | $SF_{C3}$ | MSB | MSB-1 |
|---|---|---|---|---|---|
| 1 | X | X | X | 0 | 0 |
| 0 | 1 | X | X | 0 | 1 |
| 0 | 0 | 1 | X | 1 | 0 |
| 0 | 0 | 0 | X | 1 | 1 |

The most significant bits of the device index generated by the priority encoder 541 are also supplied to the select logic 543 to select a corresponding one of the segment indices to source the least significant bits (i.e., row address component) of the device index 590.

Figure 15:
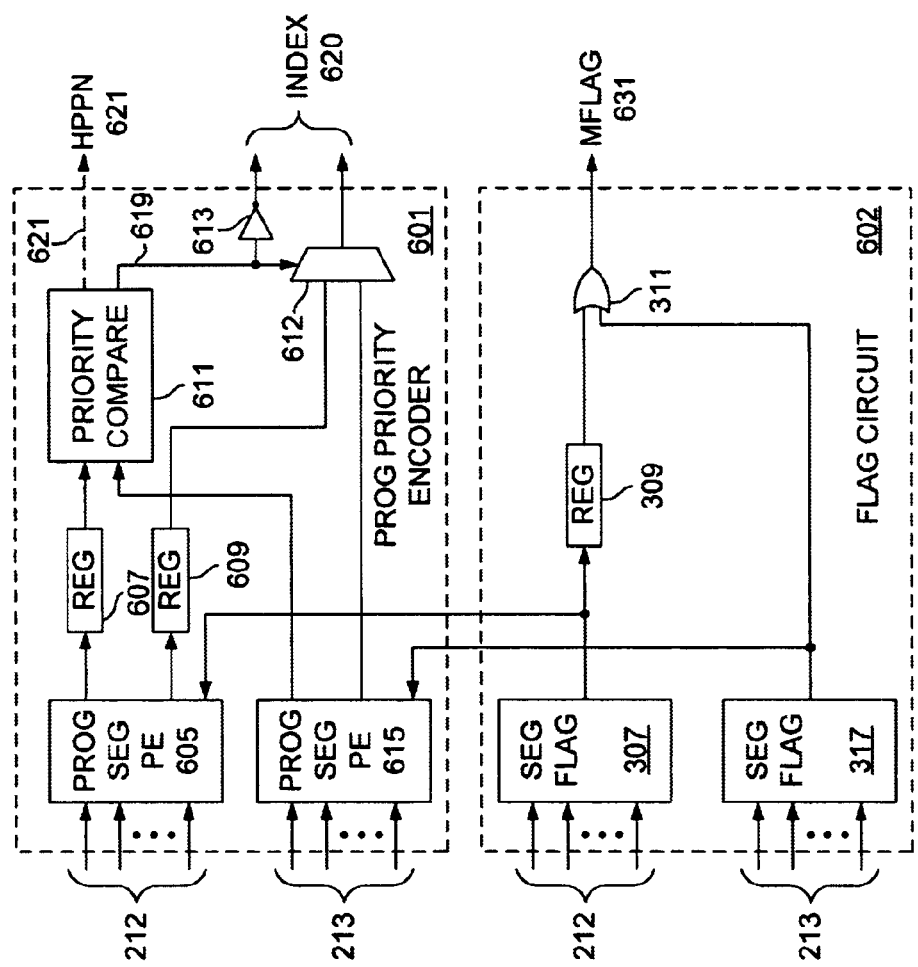
FIG. 15 illustrates an embodiment of a programmable priority encoder and flag circuit that may be used within the CAM device of FIG. 2.

FIG. 15 illustrates an embodiment of a programmable priority encoder 601 and flag circuit 602 that may be used within the CAM device of FIG. 2. The flag circuit 602 includes segment flag circuits 307 and 317 that operate as described in reference to FIG. 5 to generate a primazy segment flag $SF_P$ and cascaded segment flag $SF_C$ according to the match results indicated on match lines 212 and 213, respectively. The primary segment flag is registered in response to a primary result strobe signal (not shown in FIG. 15). The cascaded segment flag is combined with the registered primary segment flag in OR gate 311 to generate a device flag signal 631. Also, both the primary segment flag and the cascaded segment flag are provided to the programmable priority encoder 601. Additional circuitry may be provided to generate a multiple-match signal in an alternative embodiment.

The programmable priority encoder 601 includes a programmable segment priority encoder 605 coupled to the match lines 212 from the primary array segment; and a programmable segment priority encoder 615 coupled to match lines 213 from the cascaded array segment. The programmable segment priority encoders 605 and 615 each include a set of priority storage elements that correspond respectively to the incoming match lines and enable storage of a priority number that indicates a relative priority of a match signaled on the corresponding match line. Thus, priority numbers may be programmed within the programmable segment priority encoders 605 and 615 according to application needs to establish the relative priorities of entries within the CAM array. During a compare cycle, each match indication enables the corresponding priority number to be compared with all other such match-enabled priority numbers to determine a highest priority one of the match-enabled priority numbers (i.e., the highest-priority number). The address of the array segment entry which sourced the highest-priority priority number is output from the programmable segment priority encoder (i.e., 605 or 615) as a segment index and the corresponding priority number is output as a segment priority number, SPN. Thus, upon completion of a compare cycle within the primary array segment, a primary index ($SIN_P$) and a primary priority number ($SPN_P$) is output from the programmable segment priority encoder 605. The primary index and primary priority number are stored in registers 607 and 609 (e.g., in response to a primary result strobe signal) so that those values remain available until a corresponding cascaded index ($SIN_C$) and cascaded priority number ($SPN_C$) are generated by the programmable segment priority encoder 615. The registered primary priority number and the cascaded priority number are input to a priority compare circuit 611 which generates a select signal 619 according to which of the priority numbers indicates a higher priority. The select signal 619 is used to select, via multiplexer 612, either the registered primary index (i.e., from register 609) or the cascaded priority index to be output as the row address component of a device index 620. The select signal 619 is inverted by inverter 613 to generate the segment address component of the device index 620. The highest-priority priority number as between the priority numbers input to the priority compare circuit 611 may also be output from the programmable priority encoder as indicated at 621.

In the embodiment of FIG. 15, the primary and cascaded segment flags generated within flag circuit 602 are input to the programmable segment priority encoders 605 and 615, respectively, to select a default, lowest-priority priority number to be output by the programmable segment priority encoders (or either of them) if no match is signaled within the corresponding array segment. Alternatively, the programmable segment priority encoders 605 and 615 may include dedicated logic for determining a no-match condition and outputting a lowest-priority priority number in response.

Figure 16:
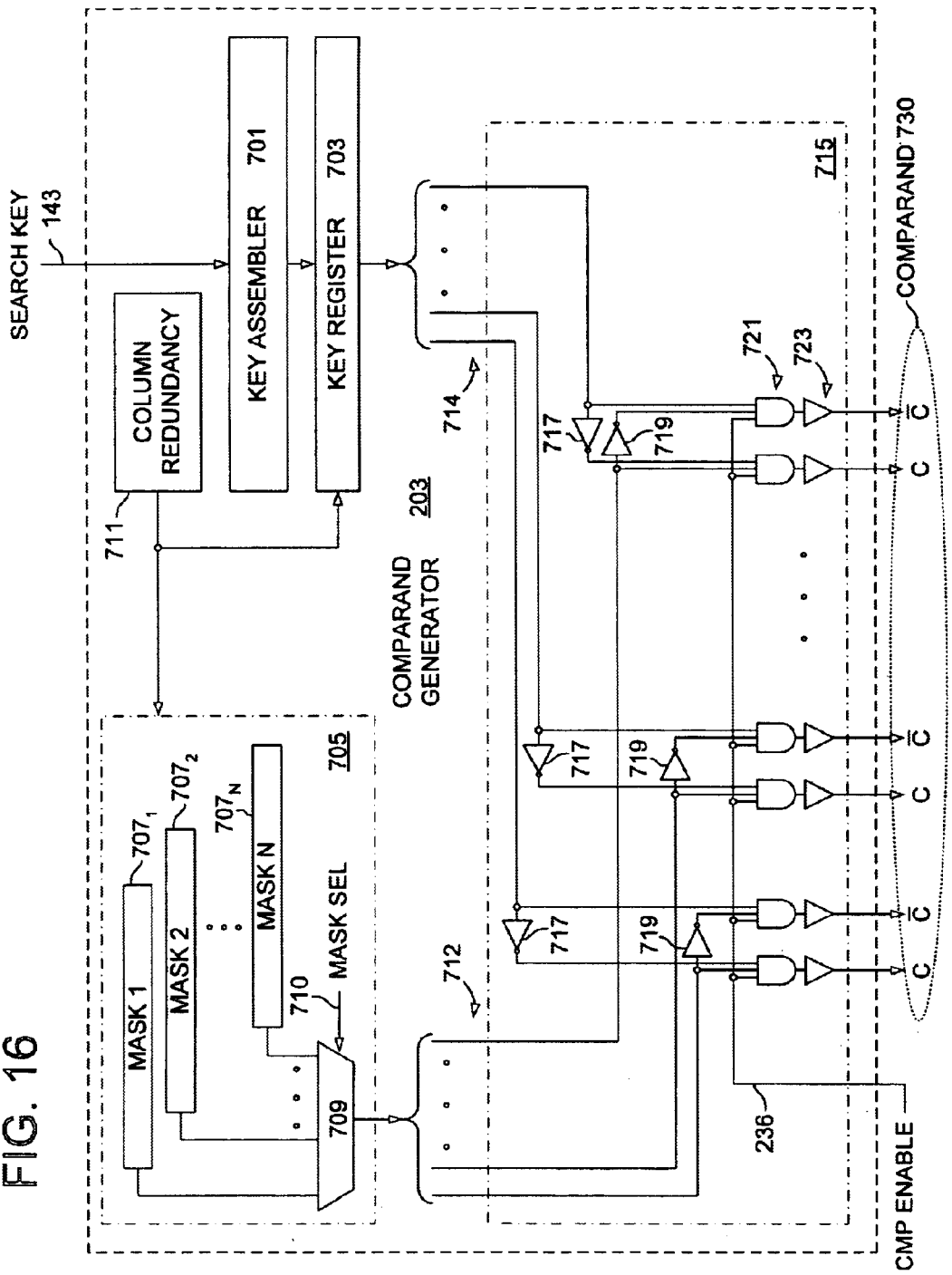
FIG. 16 illustrates a comparand generator that may be used in embodiments of the present invention.

FIG. 16 illustrates a comparand generator 203 that may be used in embodiments of the present invention. The comparand generator includes a global mask circuit 705, a column redundancy circuit 711, key assembler 701, key register 703 and a comparand driver circuit 715. A multi-bit search key is input to the comparand generator via a data bus 143, and received within the key assembler 701. The key assembler 701 includes logic for selectively re-ordering bits within the search key according to a programmable configuration of the CAM device. The resulting, assembled key 714 is stored in the key register 703 and output to the comparand driver circuit 715. The global mask circuit 705 includes a set of global mask registers $707_1$–$707_N$, one of which is selected via multiplexer 709 to output a global mask value 712 to the comparand driver 715. The global mask value 712 is used to mask selected bits within the assembled key 714, thereby producing a comparand value 730 for output to the compare lines of the primary array segment. In the embodiment of FIG. 16, a mask select signal 710 is supplied to the mask generator 705 by control logic within the CAM device (e.g., an instruction decoder) or as part of an incoming search request, and applied to a select input of the multiplexer 709 to select one of the global mask registers to source the global mask value. In an alternative embodiment, the global mask circuit 705 may be implemented by a single global mask register so that the multiplexer 709 and mask select signal 710 may be omitted. More generally, the global mask circuit 705, key assembler 701, and/or key generator may be omitted altogether from the comparand generator 203 in alternative embodiments.

The assembled key 714 from the key register 703 and the global mask value 712 from the global mask circuit 705 are each converted to respective sets of differential signals (i.e., via inverters 717 and 719, respectively). Each assembled key signal is ANDed with a corresponding one of the global mask signals in AND gates 721 to produce the comparand value 730. The compare enable signal 236 is additionally input to each of the AND gates 721 to time the output of the comparand value 730 onto the compare signal lines of the primary array segment. Output drivers 723 are provided to drive the constituent bits of the comparand value onto the corresponding compare signal lines.

Still referring to FIG. 16, the column redundancy circuit 711 is used to steer bits of the assembled key value 714 and global mask value 712 as necessary to avoid driving a comparand signal onto a defective compare signal line. One or more redundant compare signal lines may be provided within each array segment so that, if a defective compare signal line is detected within a given array segment, the column redundancy circuit 711 may be used to steer the implicated bits of the assembled key 714 and global mask value 712 away from the defective line (e.g., shifting all bits starting at the bit position of the defective line to the right or left). In an alternative embodiment, the column redundancy circuit 711 may shift the outputs of AND gates 721 rather than the assembled key 714 and global mask value 712.

Using the cascaded array architecture of the present invention, a single instance of the comparand generator 203 may be used to generate a comparand value that is cascaded from segment to segment through the entire array. In alternative embodiments, multiple comparand generators may be used. Also, multiple cascaded CAM arrays may be provided within a CAM device to enable multi-block operation, and cascaded operation within each block.

Figure 17:
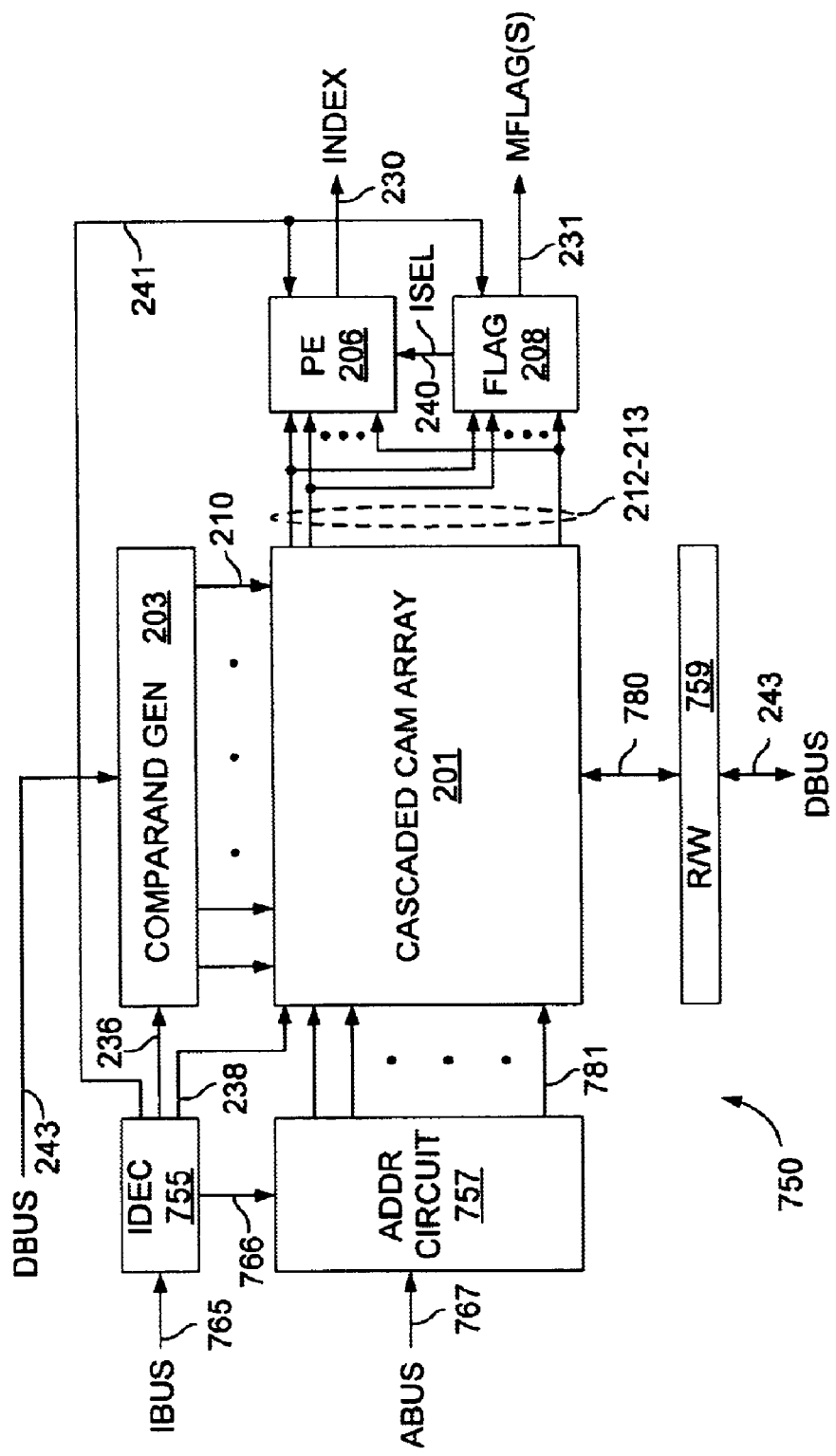
FIG. 17 illustrates a CAM device according to an embodiment of the present invention.

FIG. 17 illustrates a CAM device 750 according to an embodiment of the present invention. The CAM device 750 includes the cascaded CAM array 201, priority encoder 206, flag circuit 208 and comparand generator 203 described in reference to FIG. 2, as well as an instruction decoder 755, address circuit 757 and read/write circuit 759. The instruction decoder 755 receives commands, requests and/or instructions from one or more host devices via an instruction bus 765 and generates the timing and control signals necessary to carry out the requested operations. For example, in one embodiment, the instruction decoder 755 responds to a host-supplied search request, by issuing the compare enable, cascade strobe and result strobe signals necessary to execute search operations within the cascaded array and generate match results within the priority encoder and flag circuit. The address circuit 757 is used to address selected rows of the cascaded CAM array 201 in response to host requests or internally-generated requests (e.g., read and/or write requests generated by the instruction decoder or other logic circuit within the CAM device 750 for error checking, error correction or other purposes). The address circuit 757 receives an address from a source selected by the instruction decoder 755 (i.e., via select signal 766) and decodes the address to activate one of a plurality of word lines 781. Address sources include an address bus 767 (for receipt of externally supplied addresses), and any number of internal registers. Each word line is coupled to a corresponding row of CAM cells within the cascaded CAM array 201 and, when activated, enables read write access to the data storage elements and/or mask storage elements within the row. During a read operation, the CAM cells coupled to the activated word line are enabled to output their content (i.e., data and/or mask bits) onto bit lines 780. The read/write circuit 759 is coupled to the bit lines 780 and includes a sense amplifier bank to sense and amplify the data and/or mask value output by the selected row of CAM cells. During a write operation, a set of write drivers within the read/write circuit 759 drives a data and/or mask value onto the bit lines 780 for storage in the CAM cells coupled to the activated word line. In the embodiment of FIG. 17, a data bus 243 is used to supply search keys to the comparand generator 203 and to transfer write and to and from the read/write circuit 759. In an alternative embodiment, separate, dedicated signal paths may be provided to the comparand generator 203 and the read/write circuit 759. Also, any one or more of the signal paths depicted in FIG. 17 (i.e., instruction bus 765, address bus 767, data bus 243) may be omitted in an alternative embodiment and the corresponding signals multiplexed onto another of the signal paths.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) device comprising:
   a first storage circuit to store a comparand value in response to assertion of a first control signal;
   a first array of CAM cells coupled to receive the comparand value from the first storage circuit;
   a second storage circuit to store the comparand value in response to assertion of a second control signal, the second control signal being asserted a first time interval after the first control signal; and a second array of CAM cells coupled to receive the comparand value from the second storage circuit.

2. The CAM device of claim 1, wherein the second storage circuit is coupled to receive the comparand value from the first storage circuit.

3. The CAM device of claim 1, wherein the first array of CAM cells comprises a plurality of compare lines coupled to receive the comparand value from the first storage circuit, and wherein the first time interval is at least as long as a time required for the first comparand value to settle on the compare lines.

4. The CAM device of claim 1, further comprising a first plurality of match lines coupled to respective rows of CAM cells within the first array of CAM cells;

a second plurality of match lines coupled to respective rows of CAM cells within the second array of CAM cells; and a priority encoder having first inputs coupled to the first plurality of match lines and second inputs coupled to the second plurality of match lines.

5. The CAM device of claim 1, further comprising:

a first plurality of match lines coupled to the first array of CAM cells to signal results of a comparison of the comparand value and contents of the first array of CAM cells;

a second plurality of match lines coupled to the second array of CAM cells to signal results of a comparison of the comparand value and contents of the second array of CAM cells; and a storage circuit coupled to the first plurality of match lines to store the results of the comparison of the comparand value and the contents of the first array of CAM cells at least until the results of the comparison of the comparand value and the contents of the second array of CAM cells become valid.

6. A method of operation within a content addressable memory device, the method comprising:

storing a comparand value in a first storage circuit in response to assertion of a first control signal;

outputting the comparand value from the first storage circuit to a first array of CAM cells;

storing the comparand value in a second storage circuit in response to assertion of a second control signal, the second control signal being asserted a first time interval after the first control signal; and outputting the comparand value from the second storage circuit to a second array of CAM cells.

7. The method of claim 6 wherein storing the comparand value in the second storage circuit comprises outputting the comparand value from the first storage circuit to an input of the second storage circuit.

8. The method of claim 6 wherein the outputting the outputting the comparand value from the first storage circuit to a first array of CAM cells comprises outputting the comparand value onto a plurality of compare lines coupled to the first array of CAM cells, and wherein the first time interval is at least as long as a time required for the first comparand value to settle on the plurality of compare lines.

9. The method of claim 6 further comprising:

generating first comparison results within the first array of CAM cells in response to the comparand value;

outputting the first comparison results from the first array of CAM cells to a first plurality of inputs of an address encoding circuit;

generating second comparison results within the second array of CAM cells in response to the comparand value; and outputting the second comparison results from the second array of CAM cells to a second plurality of inputs of an address encoding circuit.

* * * * *